US012720680B2

(12) United States Patent
Cartier, Jr. et al.

(10) Patent No.: US 12,720,680 B2

(45) Date of Patent: Aug. 25, 2026

(54) MATING BACKPLANE FOR HIGH SPEED, HIGH DENSITY ELECTRICAL CONNECTOR

(71) Applicant: Amphenol Corporation, Wallingford, CT (US)

(72) Inventors: Marc B. Cartier, Jr., Durham, NH (US); Mark W. Gailus, Concord, MA (US); David Levine, Amherst, NH (US); Vysakh Sivarajan, Nashua, NH (US)

(73) Assignee: Amphenol Corporation, Wallingford, CT (US)

( * ) Notice: Subject to any disclaimer, the term of this patent is extended or adjusted under 35 U.S.C. 154(b) by 232 days.

(21) Appl. No.: 18/765,924

(22) Filed: Jul. 8, 2024

(65) Prior Publication Data

US 2025/0024602 A1 Jan. 16, 2025

Related U.S. Application Data

(60) Provisional application No. 63/512,921, filed on Jul. 11, 2023.

(51) Int. Cl.

*H05K 1/11* (2006.01)
*H05K 1/02* (2006.01)
*H05K 3/40* (2006.01)

(52) U.S. Cl.

CPC ........... *H05K 1/116* (2013.01); *H05K 1/0296* (2013.01); *H05K 3/4038* (2013.01); *H05K 2201/09636* (2013.01)

(58) Field of Classification Search

CPC .... H05K 1/116; H05K 1/0296; H05K 3/4038; H05K 2201/09636

USPC .......................................................... 174/262

See application file for complete search history.

(56) References Cited

U.S. PATENT DOCUMENTS 7,731,537 B2 6/2010 Amleshi et al.
7,794,278 B2 9/2010 Cohen et al.
7,985,097 B2 7/2011 Gulla
7,999,192 B2 8/2011 Chan et al.
8,841,560 B1 9/2014 Roberts
8,889,999 B2 11/2014 Thurairajaratnam et al.
9,560,741 B2 1/2017 Rose et al.
9,730,313 B2 8/2017 Gailus et al.
9,775,231 B2 9/2017 Cartier, Jr.

(Continued)

FOREIGN PATENT DOCUMENTS

CN 101925253 A 12/2010
CN 201709040 U 1/2011

(Continued)

*Primary Examiner* — Andargie M Aychillhum

(74) *Attorney, Agent, or Firm* — Wolf, Greenfield & Sacks, P.C.

(57) ABSTRACT

A printed circuit board includes: a plurality of layers including attachment layers and routing layers; and via patterns formed in one or more of the plurality of layers, each of the via patterns including: first and second signal vias configured to accept contact tails of signal conductors of a connector; ground vias configured to accept contact tails of ground conductors of the connector; ground shadow vias located adjacent to each of the first and second signal vias; and non-plated holes located between each of the ground shadow vias and the signal vias. Different layers of the plurality of layers may have different antipad configurations.

27 Claims, 11 Drawing Sheets

(56) References Cited

U.S. PATENT DOCUMENTS

| | | | |
|---|---|---|---|
| 9,807,869 B2 | 10/2017 | Gailus et al. | |
| 10,034,366 B2 | 7/2018 | Gailus et al. | |
| 10,187,972 B2 | 1/2019 | Charbonneau et al. | |
| 10,455,689 B2 | 10/2019 | Gailus et al. | |
| 10,849,218 B2 | 11/2020 | Gailus et al. | |
| 11,546,983 B2 | 1/2023 | Gailus et al. | |
| 11,950,356 B2 | 4/2024 | Gailus et al. | |
| 2012/0003848 A1 | 1/2012 | Casher et al. | |
| 2012/0167386 A1 | 7/2012 | Goergen et al. | |
| 2012/0199380 A1 | 8/2012 | Olsen | |
| 2013/0056254 A1* | 3/2013 | Biddle | H05K 1/0245 174/266 |
| 2013/0056255 A1 | 3/2013 | Biddle et al. | |
| 2013/0077268 A1 | 3/2013 | Brunker et al. | |
| 2013/0109232 A1 | 5/2013 | Paniaqua | |
| 2014/0004724 A1 | 1/2014 | Cartier, Jr. et al. | |
| 2014/0182891 A1 | 7/2014 | Rengarajan et al. | |
| 2014/0209370 A1 | 7/2014 | Minich | |
| 2015/0041207 A1 | 2/2015 | Tang et al. | |
| 2016/0150633 A1 | 5/2016 | Cartier, Jr. | |
| 2016/0150639 A1 | 5/2016 | Gailus et al. | |
| 2016/0150645 A1 | 5/2016 | Gailus et al. | |
| 2018/0324941 A1 | 11/2018 | Gailus et al. | |
| 2019/0380204 A1* | 12/2019 | Cartier, Jr. | H05K 1/145 |
| 2020/0022252 A1 | 1/2020 | Gailus et al. | |
| 2021/0076486 A1 | 3/2021 | Gailus et al. | |
| 2023/0113153 A1 | 4/2023 | Gailus et al. | |
| 2024/0196518 A1 | 6/2024 | Gailus et al. | |

FOREIGN PATENT DOCUMENTS

| | | |
|---|---|---|
| CN | 102265708 A | 11/2011 |
| CN | 102448249 A | 5/2012 |
| CN | 103491727 A | 1/2014 |
| CN | 103857197 A | 6/2014 |
| CN | 104040787 A | 9/2014 |
| JP | 2014-107494 A | 6/2014 |
| WO | WO 2009/023238 A1 | 2/2009 |
| WO | WO 2010/111379 A2 | 9/2010 |

* cited by examiner

MATING BACKPLANE FOR HIGH SPEED, HIGH DENSITY ELECTRICAL CONNECTOR

CROSS-REFERENCE TO RELATED APPLICATIONS

This application claims priority to and the benefit under 35 U.S.C. § 119(e) of U.S. Provisional Patent Application Ser. No. 63/512,921, filed on Jul. 11, 2023, entitled "MATING BACKPLANE FOR HIGH SPEED, HIGH DENSITY ELECTRICAL CONNECTOR," which is hereby incorporated herein by reference in its entirety.

BACKGROUND

This application relates generally to interconnection systems, such as those including electrical connectors, used to interconnect electronic assemblies.

Electrical connectors are used in many electronic systems. It is generally easier and more cost effective to manufacture a system as separate electronic assemblies, such as printed circuit boards ("PCBs"), which may be joined together with electrical connectors. A known arrangement for joining several printed circuit boards is to have one printed circuit board serve as a backplane. Other printed circuit boards, called "daughter boards" or "daughter cards," may be connected through the backplane.

A known backplane has the form of a printed circuit board onto which many connectors may be mounted. Conductive traces in the backplane may be electrically connected to signal conductors in the connectors so that signals may be routed between the connectors. Daughter cards may also have connectors mounted thereon. The connectors mounted on a daughter card may be plugged into the connectors mounted on the backplane. In this way, signals may be routed among the daughter cards through the backplane. The daughter cards may plug into the backplane at a right angle. The connectors used for these applications may therefore include a right angle bend and are often called "right angle connectors." Other known connectors include, but are not limited to, orthogonal midplane connectors and midplaneless direct attachment orthogonal connectors.

Connectors may also be used in other configurations for interconnecting printed circuit boards and for interconnecting other types of devices, such as cables, to printed circuit boards. Sometimes, one or more smaller printed circuit boards may be connected to another larger printed circuit board. In such a configuration, the larger printed circuit board may be called a "mother board" and the printed circuit boards connected to it may be called daughter boards. Also, boards of the same size or similar sizes may sometimes be aligned in parallel. Connectors used in these applications are often called "stacking connectors" or "mezzanine connectors."

Regardless of the exact application, electrical connector designs have been adapted to mirror trends in the electronics industry. Electronic systems generally have gotten smaller, faster, and functionally more complex. Because of these trends, the number of circuits in a given area of an electronic system, along with the frequencies at which the circuits operate, have increased significantly in recent years. Current systems pass more data between printed circuit boards and require electrical connectors that are electrically capable of handling more data at higher speeds than connectors of even a few years ago.

In a high density, high speed connector, electrical conductors may be so close to each other that there may be electrical interference between adjacent signal conductors. To reduce interference, and to otherwise provide desirable electrical properties, shield members are often placed between or around adjacent signal conductors. The shields may prevent signals carried on one conductor from creating "crosstalk" on another conductor. The shield may also impact the impedance of each conductor, which may further affect electrical properties.

Other techniques may be used to control the performance of a connector. For example, transmitting signals differentially may reduce crosstalk. Differential signals are carried on a pair of conductive paths, called a "differential pair." The voltage difference between the conductive paths represents the signal. In general, a differential pair is designed with preferential coupling between the conductive paths of the pair. For example, the two conductive paths of a differential pair may be arranged to run closer to each other than to adjacent signal paths in the connector. No shielding is desired between the conductive paths of the pair, but shielding may be used between differential pairs. Electrical connectors can be designed for differential signals as well as for single-ended signals.

In an interconnection system, such connectors are attached to printed circuit boards, one of which may serve as a backplane for routing signals between the electrical connectors and for providing reference planes to which reference conductors in the connectors may be grounded. Typically, the backplane is formed as a multi-layer assembly manufactured from stacks of dielectric sheets, sometimes called "prepreg". Some or all of the dielectric sheets may have a conductive film on one or both surfaces. Some of the conductive films may be patterned, using lithographic techniques, to form conductive traces that are used to make interconnections between circuit boards, circuits and/or circuit elements. Others of the conductive films may be left substantially intact and may act as ground planes or power planes that supply the reference potentials. The dielectric sheets may be formed into an integral board structure such as by pressing the stacked dielectric sheets together under pressure.

To make electrical connections to the conductive traces or ground/power planes, holes may be drilled through the printed circuit board. These holes, or "vias", may be filled or plated with metal such that a via is electrically connected to one or more of the conductive traces or planes through which it passes.

To attach connectors to the printed circuit board, contact pins or contact "tails" from the connectors may be inserted into the vias, with or without using solder. The vias are sized to accept the contact tails of the connector.

The vias on the printed circuit board may be arranged in via patterns which match the arrangement of contact tails on the connector. The via patterns may, for example, include signal vias which accept signal contact tails of the connector and ground vias which accept ground contact tails of the connector. The arrangement of via patterns on the printed circuit board, typically called a "connector footprint", may include rows and/or columns of via patterns. Examples of connector footprints are disclosed in U.S. Pat. Nos. 10,034,366; 10,455,689; 9,730,313; 9,775,231 and 10,187,972.

SUMMARY

The electrical performance of printed circuit boards that attach to connectors is at least partially dependent on printed circuit board structures, including conductive traces, ground planes, vias and other structures. Electrical performance issues become more acute as the density of signal conductors and the operating frequencies of the connectors increase. Such electrical performance issues may include, but are not limited to, crosstalk between closely spaced signal conductors and impedance variations along the signal conductors. As a consequence, improved connector footprint configurations are required to improve performance at high signal conductor densities and/or high operating frequencies.

In some embodiments, a printed circuit board comprises: a plurality of layers including attachment layers and routing layers; and via patterns formed in one or more of the plurality of layers, each of the via patterns comprising: first and second signal vias configured to accept contact tails of signal conductors of a connector; ground vias configured to accept contact tails of ground conductors of the connector; ground shadow vias located adjacent to each of the first and second signal vias; and non-plated holes located between each of the ground shadow vias and the signal vias.

In some embodiments, the non-plated holes extend to a predetermined depth in the plurality of layers.

In some embodiments, the predetermined depth is a depth of a boundary between the attachment layers and the routing layers.

In some embodiments, the predetermined depth is equal to or greater than a length of the contact tails of the signal conductors of the connector.

In some embodiments, each of the first and second signal vias is configured with a first section having a first diameter and a second section having a second diameter, less than the first diameter.

In some embodiments, the first and second signal vias are plated with a conductive material from a top surface of the printed circuit board at least to a breakout layer of the routing layers.

In some embodiments, the first and second signal vias are not plated with the conductive material below the breakout layer.

In some embodiments, each of the ground shadow vias is configured with a third section having a third diameter and a fourth section having a fourth diameter, greater than the third diameter.

In some embodiments, each of the ground shadow vias extends through the plurality of layers and is plated with a conductive material through the plurality of layers.

In some embodiments, each of the ground vias extends through the plurality of layers and is plated with a conductive material through the plurality of layers.

In some embodiments, the attachment layers include a top layer having a first antipad surrounding the first signal via, a second antipad surrounding the second signal via and a conductive strip separating the first and second antipads.

In some embodiments, the routing layers include a breakout layer having a third antipad surrounding the first signal via, a fourth antipad surrounding the second signal via and a conductive strip separating the third and fourth antipads.

In some embodiments, the routing layers immediately above and immediately below the breakout layer each include a fifth antipad surrounding the first signal via, a sixth antipad surrounding the second signal via and a conductive strip separating the fifth and sixth antipads.

In some embodiments, the attachment layers except the top layer each include a seventh antipad surrounding both the first signal via and the second signal via.

In some embodiments, the routing layers except the breakout layer and the routing layers immediately above and immediately below the breakout layer each include an eighth antipad surrounding both the first signal via and the second signal via.

In some embodiments, a center of each of the non-plated holes is equally spaced from respective centers of the of the signal vias and the ground shadow vias.

In further embodiments, a printed circuit board comprises: a plurality of layers including attachment layers and routing layers; and via patterns formed in one or more of the plurality of layers, each of the via patterns comprising: first and second signal vias configured to accept contact tails of signal conductors of a connector, wherein each of the first and second signal vias is configured with a first section having a first diameter in the attachment layers and a second section having a second diameter, less than the first diameter, in the routing layers; ground vias configured to accept contact tails of ground conductors of the connector; ground shadow vias located adjacent to each of the first and second signal vias, wherein each of the ground shadow vias is configured with a first section having a third diameter in the attachment layers and a second section having a fourth diameter, greater than the third diameter, in the routing layers; and non-plated holes located between each of the ground shadow vias and the signal vias in the attachment layers.

In some embodiments, the first diameter of the first and second signal vias is larger than the third diameter of the ground shadow vias.

In some embodiments, the second diameter of the first and second signal vias is larger than the fourth diameter of the ground shadow vias.

In some embodiments, the diameter of the non-plated holes is equal to the third diameter of the ground shadow vias.

In some embodiments, a center of each of the non-plated holes is equally spaced from respective centers of the signal vias and the ground shadow vias.

In some embodiments, the attachment layers include a top layer having a first antipad surrounding the first signal via, a second antipad surrounding the second signal via and a conductive strip separating the first and second antipads.

In some embodiments, the routing layers include a breakout layer having a third antipad surrounding the first signal via, a fourth antipad surrounding the second signal via and a conductive strip separating the third and fourth antipads.

In some embodiments, the routing layers immediately above and immediately below the breakout layer each include a fifth antipad surrounding the first signal via, a sixth antipad surrounding the second signal via and a conductive strip separating the fifth and sixth antipads.

In some embodiments, the attachment layers except the top layer each include a seventh antipad surrounding both the first signal via and the second signal via.

In some embodiments, the routing layers except the breakout layer and the routing layers immediately above and immediately below the breakout layer each include an eighth antipad surrounding both the first signal via and the second signal via.

In some embodiments, the third antipad, the fourth antipad, the fifth antipad and the sixth antipad have equal widths.

In some embodiments, the first and second antipads have larger widths than the third and fourth antipads.

In some embodiments, the seventh antipad has a larger width than the eighth antipad.

In further embodiments, a method is provided for manufacturing via patterns in a printed circuit board including a plurality of layers. The method comprises: forming first and second signal vias to accept contact tails of signal conductors of a connector; forming ground vias to accept contact tails of ground conductors of the connector; forming ground shadow vias located adjacent to each of the first and second signal vias; and forming non-plated holes located between each of the ground shadow vias and the signal vias.

BRIEF DESCRIPTION OF THE DRAWINGS

For a better understanding of the disclosed technology, reference is made to the accompanying drawings, which are incorporated herein by reference and in which.

DETAILED DESCRIPTION

The inventors have recognized and appreciated that, though substantial focus has been placed on providing improved electrical connectors in order to improve the performance of interconnection systems, at some very high frequencies significant performance improvement may be achieved by inventive designs for printed circuit boards. In accordance with some embodiments, improvements may be achieved by the incorporation of structures that alter the electrical properties of the printed circuit board in a connector footprint. The structures shown and described herein may be utilized in any type of printed circuit board, including but not limited to, backplanes, mother boards, daughter boards, orthogonally mating daughter cards that mate with or without a midplane and daughter cards that mate to a cable.

Those structures, for example, may include conducting structures, extending vertically through the board, in attachment layers of the board, to short together edges of ground planes, which might otherwise be free floating as a result of forming ground clearance around signal conductors. In some embodiments, the structures may be vias that extend only through a portion of the layers of the board, such as the attachment layers of the board where vias have larger diameters to receive compliant pins or other contact tails from a connector or other component mounted on a surface of the board. In some embodiments, the structures may be vias which are plated or filled with conductive material through some or all of the layers of the printed circuit board. In some embodiments, the vias are not plated or filled with conductive material through some or all of the layers of the printed circuit board, thus forming air holes in the printed circuit board.

Figure 1:
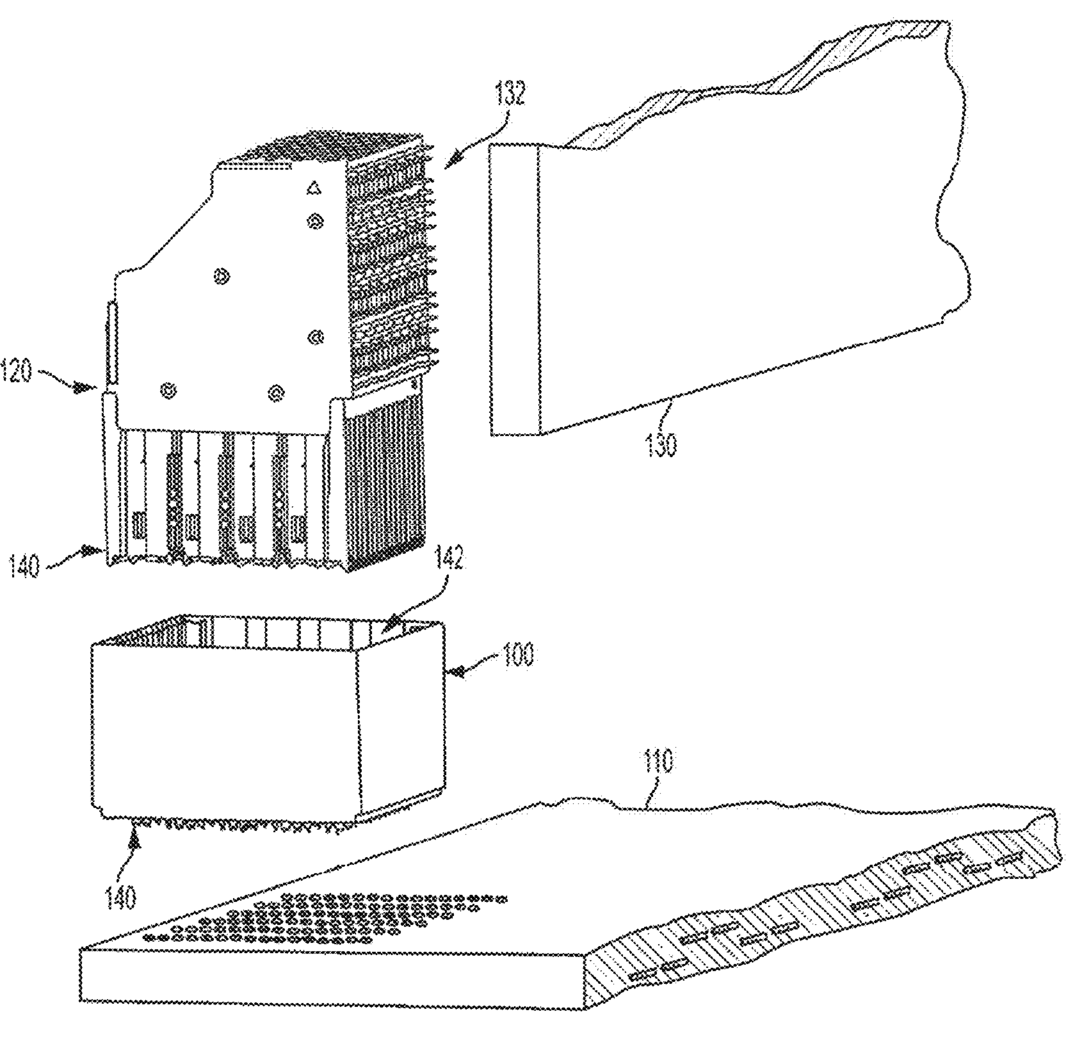
FIG. 1 is an exploded view of a high speed, high density electrical connector, a backplane and a daughter board.

FIG. 1 illustrates an example of an electrical interconnection system of the form that may be used in an electronic system. In this example, the electrical interconnection system includes a right angle connector and may be used, for example, to electrically connect a daughter card to a backplane. Two mating connectors are illustrated in FIG. 1. In this example, a backplane connector 100 is designed to be attached to a backplane 110 and a daughter card connector 120 is designed to be attached to a daughter card 130. The backplane 110 is also referred to herein as a "printed circuit board". Daughter card connector 120 includes contact tails 132 designed to attach to daughter card 130, and backplane connector 100 includes contact tails 140 designed to attach to backplane 110. These contact tails form one end of conductive elements that pass through the interconnection system. When the connectors are mounted to respective circuit boards, the contact tails make electrical connection to conductive structures within the printed circuit boards that carry signals or are connected to a reference potential.

Each of the connectors also has a mating interface where that connector can mate with or be separated from the other connector. Daughter card connector 120 includes a mating interface 140. Backplane connector 100 includes a mating interface 142. Though not fully visible in FIG. 1, mating contact portions of the conductive elements are exposed at the mating interface.

Figure 2:
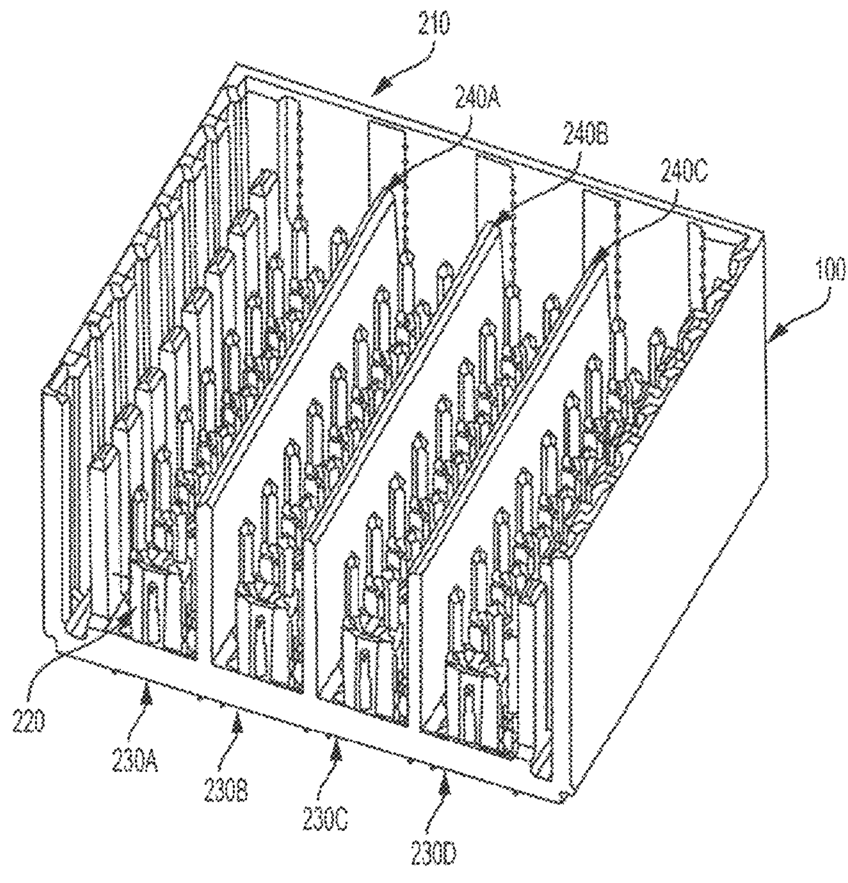
FIG. 2 illustrates a portion of the electrical connector of FIG. 1 which mates with the backplane.

Further details of the construction of the interconnection system of FIG. 1 are provided in FIG. 2, which shows backplane connector 100 partially cut away. In the embodiment of FIG. 2, a forward wall of a housing 210 is cut away to reveal the interior portions of mating interface 142. In the embodiment of FIG. 2, backplane connector 100 has a modular construction. Multiple pin modules 220 are organized to form an array of conductive elements. Each of the pin modules 220 may be designed to mate with a module of daughter card connector 120.

In the embodiment illustrated, four rows and eight columns of pin modules 220 are shown. With each pin module having two signal conductors, four rows 230A, 230B, 230C and 230D of pin modules create columns with four pairs or eight signal conductors, in total. It will be understood, however, that the number of signal conductors per row or column is not a limitation. A greater or lesser number of rows of pin modules 220 may be included within housing 210. Likewise, a greater or lesser number of columns of pin modules 220 may be included within housing 210. Alternatively or additionally, housing 210 may be regarded as a module of a backplane connector, and multiple such modules may be aligned side-to-side to extend the length of a backplane connector.

In the embodiment of FIG. 2, each of the pin modules 220 contains conductive elements which function as signal conductors. Those signal conductors are held within insulative members, which may serve as a portion of the housing 210. The insulated portions of the pin modules 220 may be positioned to separate the signal conductors from other portions of housing 210. In this configuration, other portions of housing 210 may be conductive or partially conductive. Lossy or conductive members may be positioned adjacent to rows 230A, 230B, 230C and 230D of pin modules 220. In the embodiment of FIG. 2, separators 240A, 240B and 240C are provided between adjacent rows of pin modules.

Figure 3:
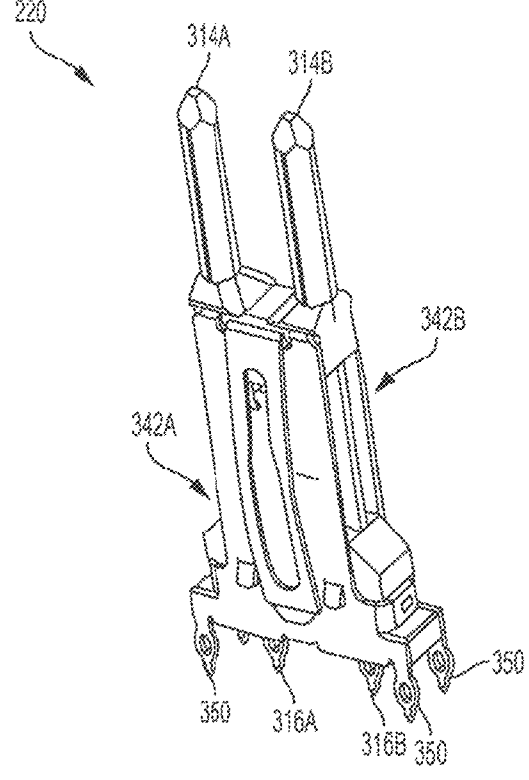
FIG. 3 illustrates a pin module of the electrical connector of FIG. 2.

FIG. 3 illustrates a pin module 220 in greater detail. Each pin module 220 includes a pair of conductive elements acting as signal conductors 314A and 314B. Each of the signal conductors has a mating interface portion shaped as a pin. Opposite ends of the signal conductors have contact tails 316A and 316B for making electrical connections to vias in a printed circuit board, such as backplane 110. In this embodiment, the contact tails are shaped as press-fit compliant sections. Intermediate portions of the signal conductors pass through pin module 220.

Conductive elements serving as reference conductors 342A and 342B are attached at opposite exterior surfaces of pin module 220. Each of the reference conductors has contact tails 350, shaped for making electrical connections to vias in a printed circuit board, such as backplane 110. The reference conductors also have mating contact portions.

Figure 4:
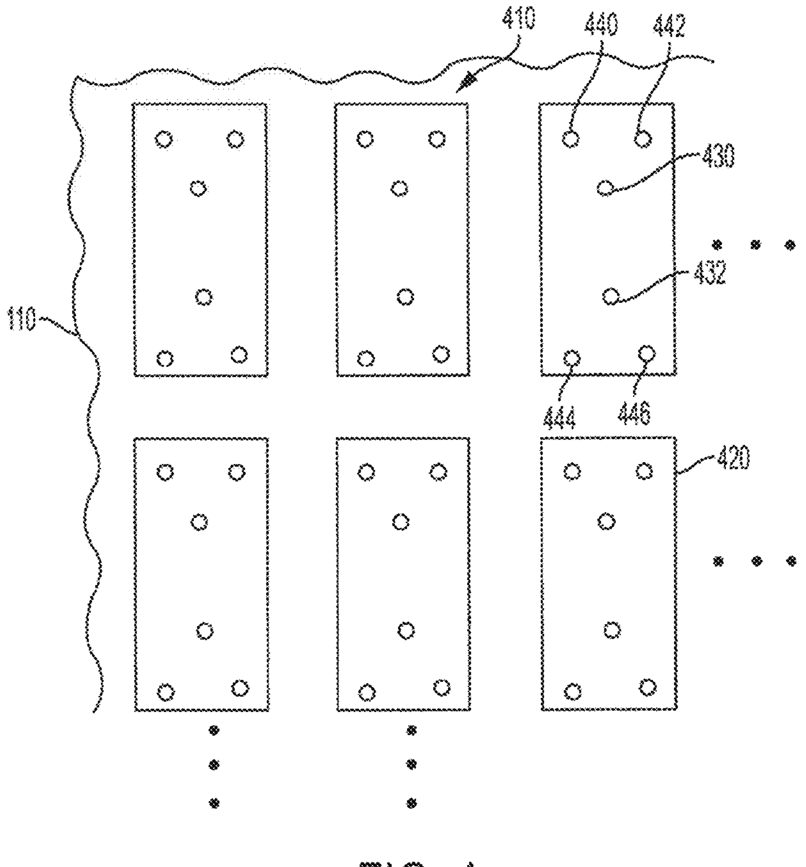
FIG. 4 is a partial top view of a backplane having an array of differential pair connections.

Embodiments of a printed circuit board are described with reference to FIG. 4. A partial top view of backplane 110 showing a connector footprint 410 of vias for mating with the contact tails of backplane connector 100 is shown in FIG. 4. The backplane 110 may be implemented as a printed circuit board as described below. As shown, the connector footprint 410 includes an array of rows and columns of via patterns 420. Each via pattern 420 corresponds to one differential pair of signal conductors and associated reference conductors, as well as other vias not shown in FIG. 4 but described below. As shown, each via pattern 420 includes a first signal via 430 and a second signal via 432, which form a differential signal pair, and ground vias 440, 442, 444 and 446 associated with each pair of signal vias 430, 432. It will be understood that each of the via patterns 420 matches a pattern of contact tails 316A, 316B and 350 of pin module 220 shown in FIG. 3 and described above. Further, the array of via patterns 420 in backplane 110 matches the array of pin modules 220 in backplane connector 100. It will be understood that the parameters of connector footprint 410 may vary, including the number and arrangement of via patterns 420 and the configuration of each via pattern 420, provided that the connector footprint 410 matches the pattern of contact tails in backplane connector 100. In some embodiments, columns of via patterns may be offset from each other in a vertical direction.

Figure 5:
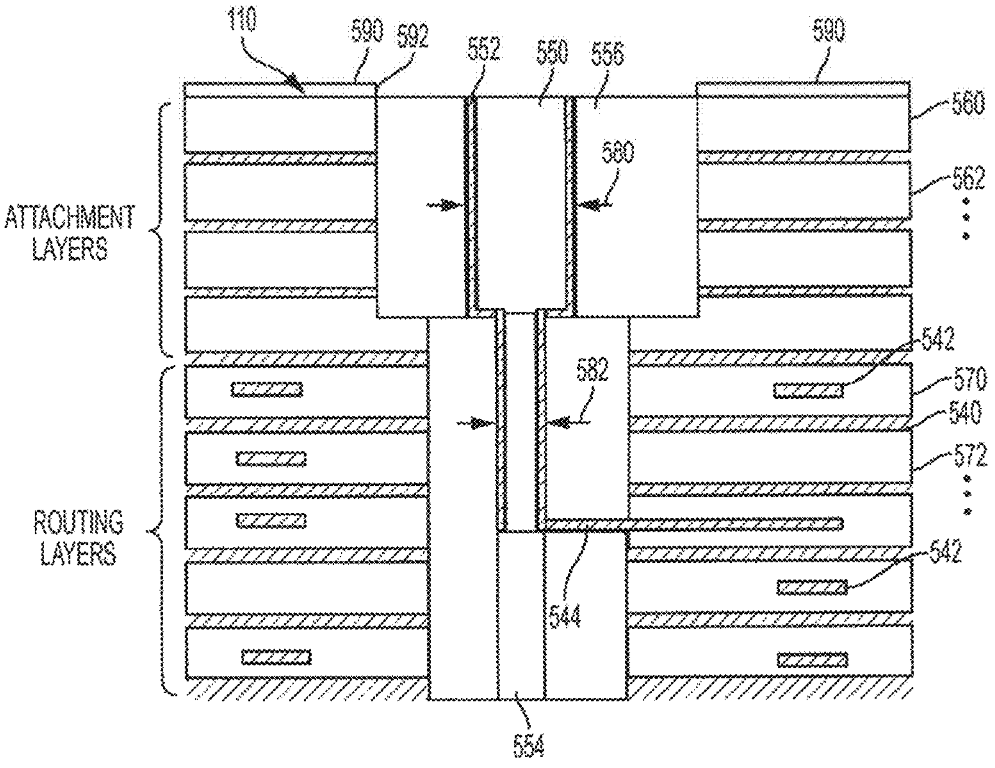
FIG. 5 is a simplified cross-section of a backplane.

Further embodiments of a printed circuit board are described with reference to FIG. 5. A simplified cross-sectional view of a portion of backplane 110 in accordance with embodiments is shown in FIG. 5. The portion shown may be representative of a signal via in a connector footprint. FIG. 5 shows the layered structure of backplane 110 and a signal via 550 for purposes of illustration. It will be understood that an actual backplane 110 includes multiple, closely spaced vias in particular patterns as described below. The backplane 110 may be implemented as a printed circuit board.

As further shown in FIG. 5, the backplane 110 includes multiple layers. Each layer of the multiple layers of backplane 110 may include a conductive layer and a dielectric sheet, so that the backplane 110 includes an alternating arrangement of conductive layers and dielectric sheets. Each conductive layer may serve as a ground plane, may be patterned to form conductive traces, or may include a ground plane and conductive traces in different areas. The layers may be formed, during assembly, by stacking multiple sheets of laminate with patterned copper and prepreg and then pressing them under heat to fuse all the sheets. Patterning the copper may create traces and other conductive structures within the printed circuit board. As a result of fusing, the layers might not be structurally separable in a finished backplane. However, the layers may nonetheless be recognized in the fused structure based on the position of the conductive structures.

The layers may be allocated for different functions and accordingly may have different structural characteristics. In some embodiments, a first portion of the layers, those nearest a surface, may have vias that are wide enough to receive a contact tail from a component mounted to the surface. These layers may be called "attachment layers". A second portion of the layers may have narrower vias, creating wider routing channels. These layers may be called "routing layers."

In the illustrated embodiment, the backplane 110 includes attachment layers 560, 562, etc. and routing layers 570, 572, etc. The attachment layers are located in an upper portion of the backplane 110 and the routing layers are located below the attachment layers. The attachment layers 560, 562, etc. and the routing layers 570, 572, etc. are adhered together to form a single structure in the form of a printed circuit board. The number of attachment layers and the number of routing layers in a particular backplane may vary according to application.

As shown in FIG. 5, backplane 110 may include ground planes 540 between the dielectric layers of the structure and may include signal traces 542 in or between the routing layers. A signal trace 544 is shown as connected to signal via 550.

The signal via 550 includes plating 552 in the attachment layers and in one or more of the routing layers. The signal via 550 may be backdrilled in a lower region 554 of backplane 110 to remove the plating. A ground clearance 556 is provided between signal via 550 and the ground planes 540.

As further shown in FIG. 5, the via 550 has a first diameter 580 in the attachment layers and a second diameter 582 in the routing layers. The first diameter 580 is larger than the second diameter 582. In particular, the first diameter 580 is selected to accept a contact tail of the backplane connector 100, and the second diameter 582 is selected in accordance with typical via diameters for printed circuit boards. Because the via 550 has a relatively large first diameter 580 and because the vias are closely spaced to match high density backplane connector 100, little area remains in attachment layers 560, 562, etc. for signal routing. In routing layers 570, 572, etc. which are below the vias of the attachment layers, additional area is available for signal routing.

In some embodiments, the vias may have the same diameter in the attachment layers and in the routing layers. For example, the contact elements of the connector may attach to pads on the surface of the backplane 110 in a surface mount configuration.

In some embodiments, the backplane 110 may include a conductive surface layer 590 on its top surface. The conductive surface layer 590 is patterned to provide an antipad 592, or non-conductive area, around each of the signal vias. The conductive surface layer 590 may be connected to some or all of the ground vias and may provide a contact for a connector ground, such as a conductive gasket or a conductive finger.

Embodiments of a printed circuit board are described with reference to FIGS. 6-11. It should be appreciated that FIGS. 6-11 are partially schematic in that all of the illustrated structures may not in all embodiments be seen in a visual inspection of the top of a printed circuit board. A coating may be placed over the board that obscures some of the structures. In addition, some structures may be formed on layers below the surface of the board. Those layers may nonetheless be shown in a top view so that the relative positions of structures in the layers may be understood. For example, signal traces and ground planes may not both be visible in the same view of the board, as they are on different vertical planes within the printed circuit board. However, because the relative positioning of signal and ground structures may be important to performance of a printed circuit board, both may be shown in what is referred to as a top view.

Figure 6:
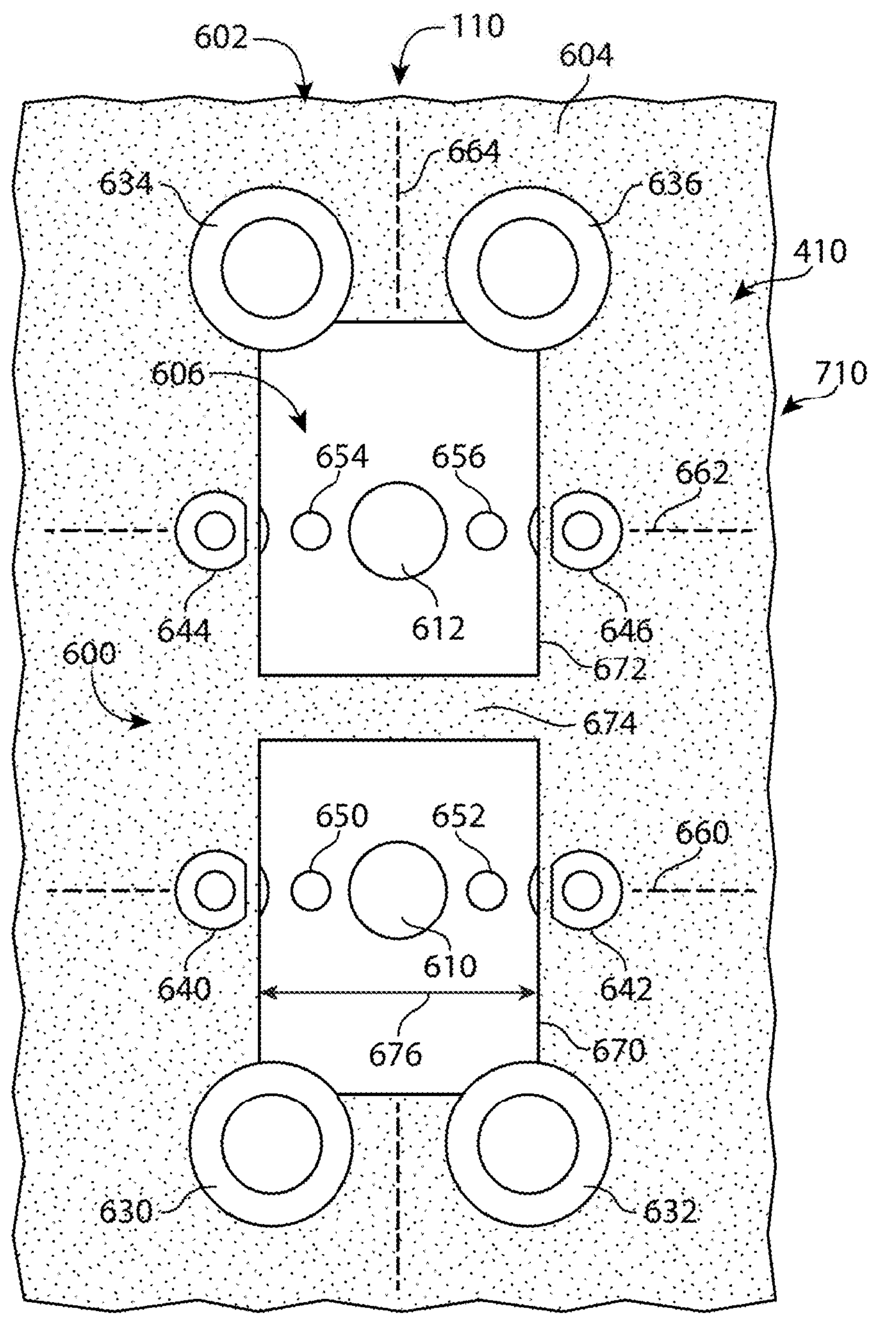
FIG. 6 is a partial top view of a top layer of a printed circuit board, in accordance with embodiments.

A partial top view of an embodiment of an attachment layer is shown in FIG. 6. FIG. 6 shows a via pattern 600 of the connector footprint 410 of backplane 110.

The via pattern 600 may be formed in a top attachment layer 602 of the backplane 110, and the top attachment layer 602 may include a ground plane 604 of conductive material formed on a dielectric sheet 606. The via pattern 600 includes a first signal via 610 and a second signal via 612, which may form a differential signal pair. The signal vias 610 and 612 extend vertically through the attachment layers and have diameters in the attachment layers that are selected to accept the contact tails 316A, 316B (FIG. 3) of backplane connector 100. In some embodiments, the signal vias 610 and 612 may have different diameters in the attachment layers and in the routing layers, as described below.

The via pattern 600 further includes ground vias 630, 632, 634 and 636 associated with signal vias 610 and 612. In the embodiment of FIG. 6, ground vias 630 and 632 may be located at one end of the via pattern 600 adjacent to signal via 610, and ground vias 634 and 636 may be located at an opposite end of the via pattern 600 adjacent to signal via 612. The ground vias 630, 632, 634 and 636 are dimensioned to accept corresponding contact tails 350 (FIG. 3) of backplane connector 100. The ground vias interconnect ground planes of some or all of the layers of the backplane 110. The ground vias may extend through all of the layers of the backplane 110 and may be plated with a conductive material.

The via pattern 600 further includes ground shadow vias 640, 642, 644 and 646. The ground shadow vias 640 and 642 are located on opposite sides of signal via 610, and ground shadow vias 644 and 646 are located on opposite sides of signal via 612. The ground shadow vias 640, 642, 644 and 646 extend through the backplane 110 and are plated with a conductive material. In some embodiments, the ground shadow vias 640, 642, 644 and 646 may have different diameters in the attachment layers and in the routing layers, as described below.

The via pattern 600 further includes non-plated holes 650, 652, 654 and 656. The non-plated holes 650 and 652 are located on opposite sides of signal via 610, and non-plated holes 654 and 656 are located on opposite sides of signal via 612. Further, the non-plated holes 650, 652, 654 and 656 are located between the respective ground shadow vias and the signal vias. Thus, non-plated hole 650 is located between shadow via 640 and signal via 610; non-plated hole 652 is located between shadow via 642 and signal via 610; non-plated hole 654 is located between shadow via 644 and signal via 612; and non-plated hole 656 is located between shadow via 646 and signal via 612. The non-plated holes 650, 652, 654 and 656 extend through the attachment layers, but do not extend through the routing layers. The non-plated holes are not plated with a conductive material and effectively serve as air holes.

In the embodiment of FIG. 6, ground shadow vias 640 and 642 and non-plated holes 650 and 652 may be located along an imaginary line 660 that passes through signal via 610. Also, ground shadow vias 644 and 646 and non-plated holes 654 and 656 may be located along an imaginary line 662 that passes through signal via 612. The lines 660 and 662 are perpendicular to an imaginary line 664 that passes through signal vias 610 and 612.

In some embodiments, the centers of the non-plated holes 650, 652, 654 and 656 are equally spaced from the respective centers of the signal vias 610 and 612 and the centers of the ground shadow vias 640, 642, 644 and 646. Thus, for example, the center of non-plated hole 650 is equally spaced from the center of signal via 610 and from the center of ground shadow via 640. It will be understood that these locations are not limiting.

In forming the backplane 110, ground plane 604 is partially removed, such as by patterning a copper layer on a laminate, to form one or more antipads, thereby forming a ground clearance surrounding signal vias 610 and 612, so that the dielectric sheet 606 of attachment layer 602 is exposed. In the embodiment of FIG. 6, the via pattern 600 of the top layer 602 of the printed circuit board includes a first antipad 670 surrounding signal via 610 and a second antipad 672 surrounding signal via 612. The antipads 670 and 672 are separated by a conductive strip 674 between signal vias 610 and 612. The antipads 670 and 672 have sizes and shapes to preclude shorting of ground plane 604 to signal vias 610 and 612, even if there is some imprecision in forming the vias relative to ground plane 604, and to establish a desired impedance of the signal path formed by signal vias 610 and 612.

In the embodiment of FIG. 6, the antipads 670 and 672 are rectangular in shape and have a width 676, and the signal vias 610 and 612 are centrally located in the respective antipads. However, the antipads 670 and 672 may have any suitable shape. In some embodiments, the conductive strip 674 is eliminated, so that a single antipad surrounds both signal vias 610 and 612.

As noted above, the signal vias 610 and 612 are electrically isolated from ground plane 604. The ground vias 630, 632, 634 and 636 and the ground shadow vias 640, 642, 644 and 646 are in electrical contact with ground plane 604. The non-plated holes 650, 652, 654 and 656 are formed within antipads 670 and 672 in the embodiment of FIG. 6. However, since the non-plated holes do not include a conductive material, contact with the ground plane 604 is not an issue.

Figure 7:
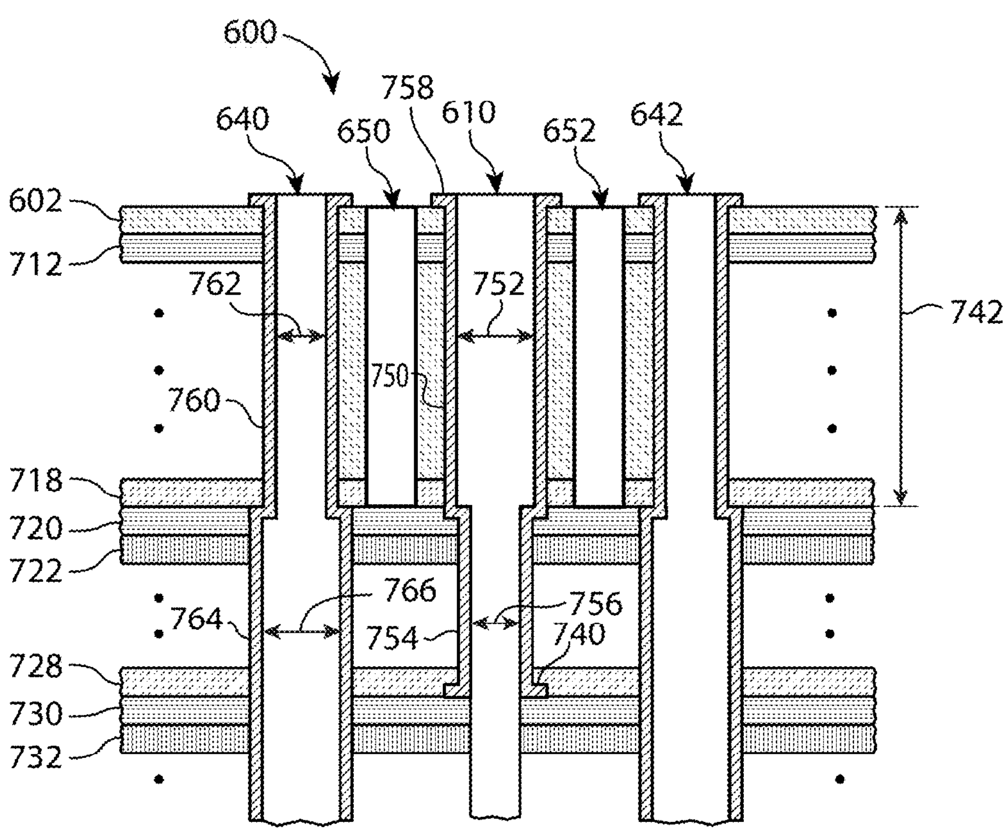
FIG. 7 is a simplified cross-sectional view of the printed circuit board of FIG. 6.

A cross section of the backplane 110 along the line 660 of FIG. 6 is shown in FIG. 7. Like elements in FIGS. 6 and 7 have the same reference numerals. As shown, signal via 610 extends through attachment layers 602, 712, etc. and one or more of routing layers 720, 722, etc. and provides a connection to a signal trace on at least one of the routing layers, known as a signal breakout layer. A signal breakout layer 730 is shown in FIG. 7 with a contact pad 740 on signal via 610 connecting to the signal trace 840 shown in FIG. 8.

Non-plated holes 650 and 652 are located adjacent to signal via 610 and are not plated with a conductive material. The non-plated holes 650 and 652 extend below the surface of the backplane 110 to a predetermined depth 742. In some embodiments, the predetermined depth 742 may correspond to the length of the contact tails of connector 100 or may be slightly greater than the length of the contact tails. In some embodiments, the predetermined depth 742 may be the depth of a boundary between the attachment layers and the routing layers, such that layers above the predetermined depth are attachment layers and layers below the predetermined depth are routing layers. In some embodiments, the predetermined depth 742 may be 1 mm.

The ground shadow vias 640 and 642 are located adjacent to non-plated holes 650 and 652, respectively. The ground shadow vias 640 and 642 extend through the attachment layers and through the routing layers of backplane 110 and are plated with a conductive material. As shown in FIG. 7, non-plated hole 650 is located between ground shadow via 640 and signal via 610 in the attachment layers, and non-plated hole 652 is located between ground shadow via 642 and signal via 610 in the attachment layers. As noted above, the center of non-plated hole 650 may be equally spaced from the center of signal via 610 and from the center of ground shadow via 640.

The signal via 610 extends through the attachment layers and through at least one of the routing layers of backplane 110. The signal via 610 is plated with a conductive material at least from the top surface of backplane 110 to breakout layer 730. The signal via 610 may be formed by drilling a hole fully through the printed circuit board, plating the hole and then removing portions of the plating below the breakout layer 730, typically by backdrilling.

In the embodiment of FIG. 7, the signal via 610 has a first section 750 having a first diameter 752 and a second section 754 having a second diameter 756. The first section 750 may extend through the attachment layers to the predetermined depth 742, and the second section 754 may extend through at least one of the routing layers. The first diameter 752 may be larger than the second diameter 756 and may be selected to accept a contact tail 140 of backplane connector 100 (FIG. 1). The signal via 610 is plated with a conductive material, at least from the top layer 602 to the breakout layer 730. The signal via 610 may include a contact pad 758 on the top layer of the backplane 110 and may include contact pad 740 on the breakout layer 730 where the signal trace is connected.

As further shown in FIG. 7, shadow via 640 includes a first section 760 having a third diameter 762 and a second section 764 having a fourth diameter 766. The fourth diameter 766 may be larger than the third diameter 762. The length of the first section 760 of shadow via 640 may be somewhat less than, equal to or somewhat greater than the length of the first section 750 of signal via 610. Shadow via 640 is provided with contact pads (not shown) which may connect to some or all ground planes in the attachment layers and the routing layers. Shadow via 642 may have the same configuration as shadow via 640.

The third and fourth diameters of the shadow vias may be selected to avoid impedance discontinuities along the signal vias, despite the change in diameter of the signal vias. One non-limiting example of dimensions of the signal vias and the shadow vias is described below. The signal vias and the shadow vias may both change diameter at or near the predetermined depth which corresponds to the length of the contact tails of the connector.

In one non-limiting example, the first diameter 752 of the first section 750 of signal via 610 may be 0.31 mm+/−0.05 mm finished hole size and the second diameter 756 of the second section 754 may be 0.27 mm+/−0.05 mm finished hole size. The first diameter 762 of the first section 760 of ground shadow via 640 may be 0.064 mm+/−0.05 mm finished hole size and the second diameter 756 of the second section 754 may be 0.114 mm+/−0.05 mm finished hole size. The non-plated hole 650 may have a diameter of 0.150 mm in this example. Furthermore, a center-to-center spacing between signal via 610 and ground shadow via 640 may be 0.72 mm, and a center-to-center spacing between signal via 610 and non-plated hole 650 may be 0.358 mm in this example. It will be understood that these dimensions are not limiting and that other dimensions may be utilized.

In other embodiments, the signal via 610 and the shadow via 640 may have uniform diameters through the layers of the backplane 110. The diameter of the shadow via 640 may be smaller than the diameter of the signal via 610, but this is not a requirement.

Figure 8:
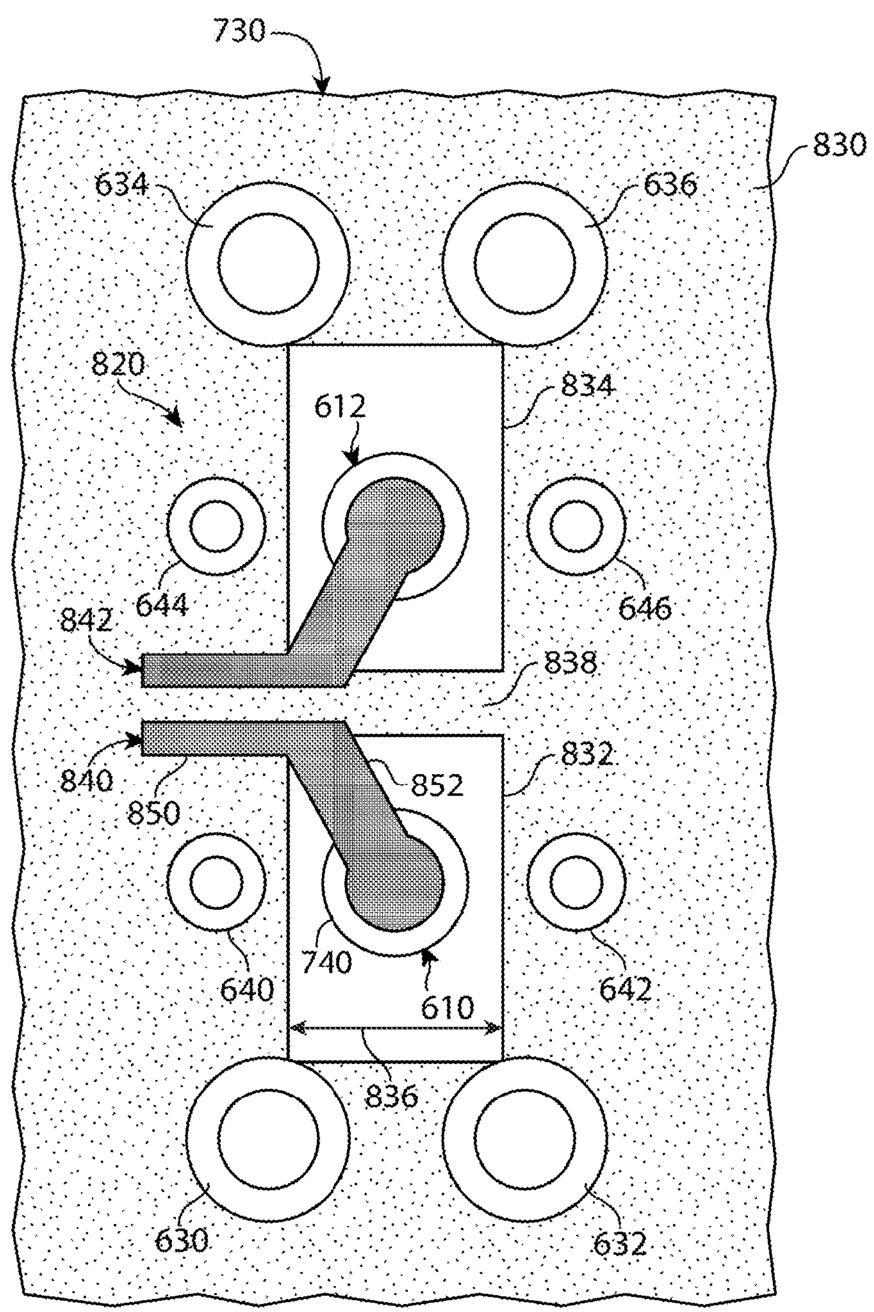
FIG. 8 is a partial top view of a breakout layer in the printed circuit board of FIGS. 6 and 7.

A partial top view of an embodiment of breakout layer 730 (FIG. 7) is shown in FIG. 8. A via pattern 820 is shown in FIG. 8. It will be understood that via pattern 820 is vertically aligned with via pattern 600. It will further be understood that the via pattern 820 is not visible in the backplane 110 after the layers of the backplane are pressed together. The position of the breakout layer 730 in the layers of the backplane 110 is shown in FIG. 7. It will be understood that different signal vias in the connector footprint connect to different routing layers according to signal routing requirements.

The via pattern 820 of breakout layer 730 includes signal vias 610 and 612 which extend vertically through the attachment layers and at least to breakout layer 730. The signal vias 610 and 612 may have smaller diameters in the routing layers than in the attachment layers.

In forming the backplane 110, a ground plane 830 is partially removed to form a third antipad 832 surrounding signal via 610 and a fourth antipad 834 surrounding signal via 612. The antipads 832 and 834 may have a width 836 that is smaller than the width 676 (FIG. 6) of the antipads 670 and 672 of top attachment layer 602. However, this is not a requirement and in some embodiments the separation between the signal vias and the edges of the ground plane may be selected at each layer to provide a desired impedance or to otherwise provide desired electrical properties. In the embodiment of FIG. 8, the antipads 832 and 834 are rectangular in shape and are separated by a conductive strip 838. In other embodiments, a single antipad may surround signal vias 610 and 612.

The via pattern 820 of breakout layer 730 also includes ground vias 630, 632, 634 and 636 which have the same locations and configurations as the corresponding ground vias in top attachment layer 602. The ground vias typically interconnect the ground planes of all the layers of the backplane 110.

The via pattern 820 of breakout layer 730 further includes ground shadow vias 640, 642, 644 and 646 which extend vertically through the attachment layers and the routing layers. The diameters of the ground shadow vias in the breakout layer 730 may be larger than the diameters of the ground shadow vias in the attachment layers. The non-plated holes 650, 652, 654 and 656 (FIG. 6) do not extend to the breakout layer 730 and are not shown in FIG. 8.

The via pattern 820 further includes a signal trace 840 connected to signal via 610 and a signal trace 842 connected to signal via 612. The signal traces 840 and 842 provide electrical connections between the respective signal vias 610 and 612 and other electrical components on the printed circuit board. The signal traces 840 and 842 are formed on a dielectric layer (not shown in FIG. 8) and are vertically separated from the ground plane 830 by the dielectric layer.

As shown in FIG. 8, the signal traces 840 and 842 enter the via pattern 820 near the central portion thereof in a parallel configuration and then split apart near the corners of the antipads 832 and 834 toward the respective signal vias 610 and 612. Each of the signal traces may include a first section 850 having a first width, a second section 852 having a second width, and contact pad 740 that surrounds the respective signal via.

The first width of the first section 850 may be smaller than the second width of the second section 852. As can be seen in FIG. 8, the first section 850 of signal trace 840 is routed above ground plane 830, while the second section 852 of signal trace 840 is routed above antipad 832. The first width of the first section 850 is selected in accordance with the dimensional rules of the printed circuit board. The second width of the second section 852 is selected to limit impedance changes as the signal trace 840 passes over antipad 832.

Figure 9:
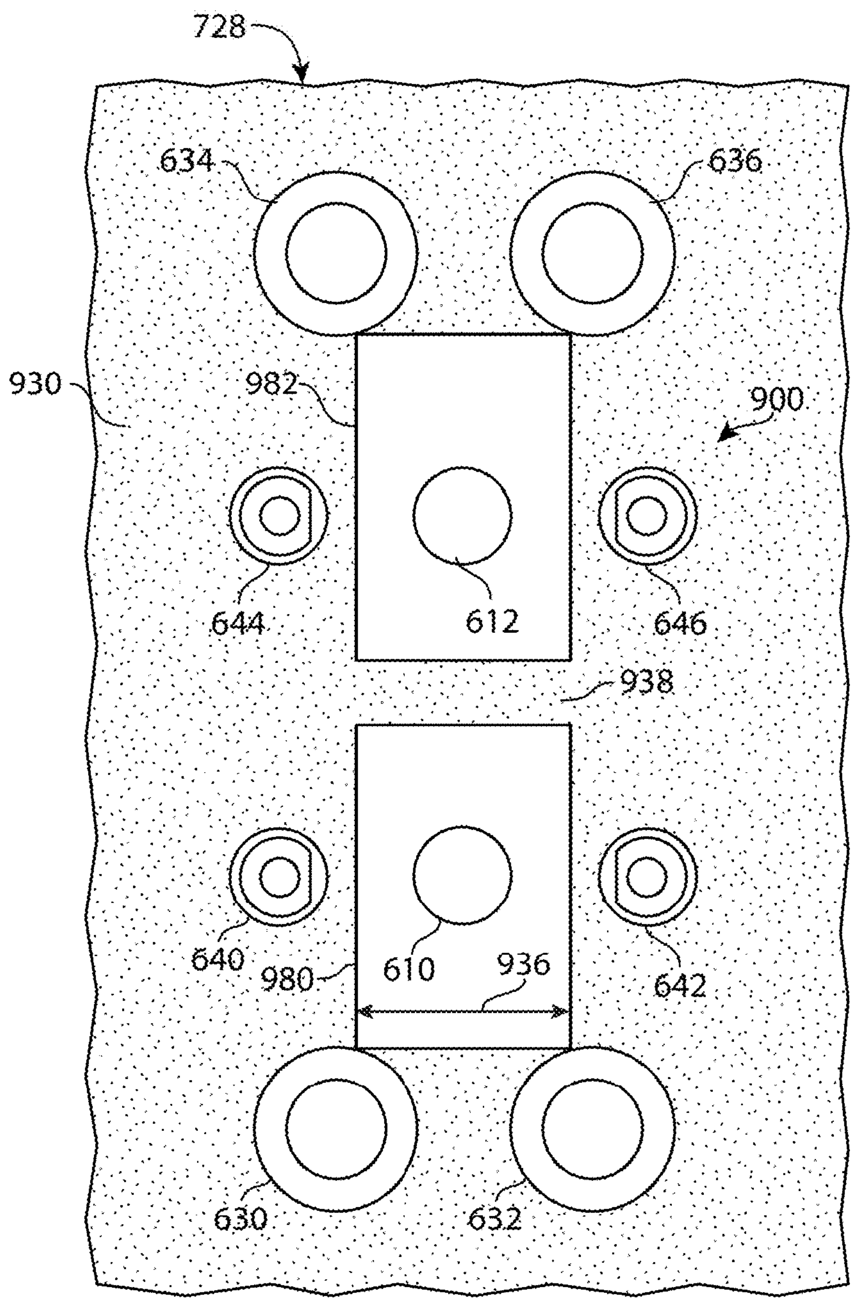
FIG. 9 is a partial top view of a routing layer immediately above the breakout layer in the printed circuit board of FIGS. 6 and 7.

A partial top view of an embodiment of layer 728 (FIG. 7) is shown in FIG. 9. Layer 728 is the layer above breakout layer 730. Layer 732, which is the layer below breakout layer 730, may have the same configuration as the layer 728 shown in FIG. 9. As such, FIG. 9 represents the layers above and below the breakout layer 730. Layer 728 is a routing layer.

A via pattern 900 is shown in FIG. 9. It will be understood that via pattern 900 is vertically aligned with via patterns 600 (FIG. 6) and 820 (FIG. 8). It will further be understood that the via pattern 900 is not visible in the backplane 110 after the layers of the backplane are pressed together.

The via pattern 900 of layer 728 includes signal vias 610 and 612. The signal vias 610 and 612 may have smaller diameters in the routing layers than in the attachment layers.

In forming the backplane 110, a ground plane 930 is partially removed to form a fifth antipad 980 surrounding signal via 610 and a sixth antipad 982 surrounding signal via 612. The antipads 980 and 982 may have the same dimensions as the antipads 832 and 834 of breakout layer 730 and may have smaller dimensions than the antipads 670 and 672 of top layer 602. In particular, antipads 980 and 982 may have a width 936 that is equal to the width 836 of antipads 832 and 834 of breakout layer 730 (FIG. 8). However, these are not requirements and, in some embodiments, the separation between the signal vias and the edges of the ground plane may be selected at each layer to provide a desired impedance or to otherwise provide desired electrical properties. In the embodiment of FIG. 9, the antipads 980 and 982 are rectangular in shape and are separated by a conductive strip 938. In other embodiments, a single antipad may surround signal vias 610 and 612 in via pattern 900.

The via pattern 900 of layer 728 also includes ground vias 630, 632, 634 and 636 which have the same locations and configurations as the corresponding ground vias in top attachment layer 602. The ground vias typically interconnect the ground planes of all the layers of the backplane 110.

The via pattern 900 of layer 728 further includes ground shadow vias 640, 642, 644 and 646 which extend vertically through the attachment layers and the routing layers. The diameters of the ground shadow vias in the layer 728 may be larger than the diameters of the ground shadow vias in the attachment layers. The non-plated holes 650, 652, 654 and 656 (FIG. 6) do not extend to the layer 728 and are not shown in FIG. 9.

Figure 10:
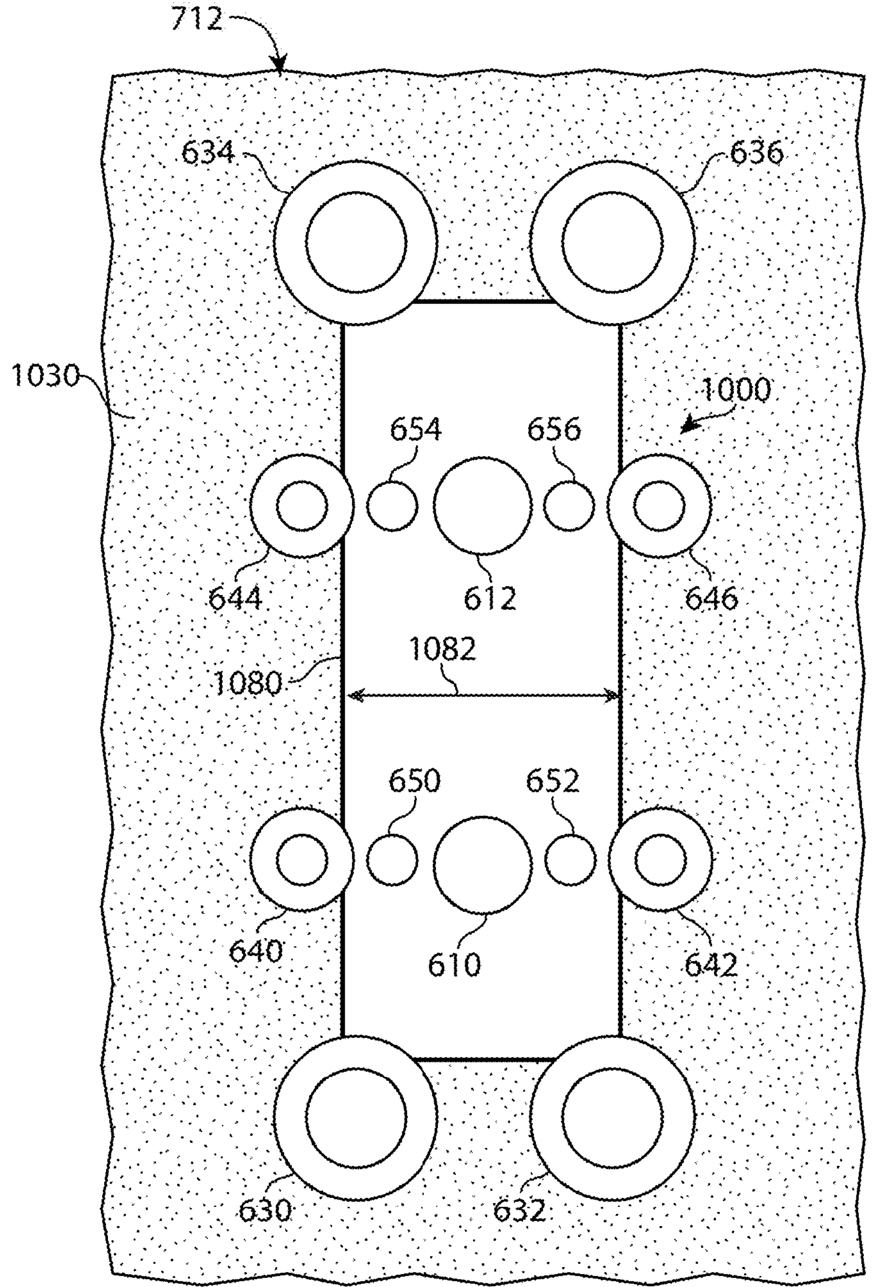
FIG. 10 is a partial top view of an attachment layer below the top layer in the printed circuit board of FIGS. 6 and 7.

A partial top view of an embodiment of layer 712 (FIG. 7) is shown in FIG. 10. Layer 712 is the layer below the top layer 602. Layer 712 is representative of the layers between top layer 602 and layer 718 at the predetermined the depth. Layer 712 is an attachment layer.

A via pattern 1000 is shown in FIG. 10. It will be understood that via pattern 1000 is vertically aligned with via patterns 600 (FIG. 6) and 820 (FIG. 8). It will further be understood that the via pattern 1000 is not visible in the backplane 110 after the layers of the backplane are pressed together.

The via pattern 1000 of layer 712 includes signal vias 610 and 612. The signal vias 610 and 612 may have larger diameters in the attachment layers than in the routing layers.

In forming the backplane 110, a ground plane 1030 is partially removed to form a seventh antipad 1080 surrounding both signal via 610 and signal via 612. The antipad 1080 may have a width 1082 that is equal to or slightly greater than the width of antipads 670 and 672 (FIG. 6) in top layer 602. The width 1082 of antipad 1080 is selected based on the diameters of signal vias 610 and 612 in layer 712. As such, the width 1082 of the antipad 1080 in the attachment layers may be greater than the width of the antipads in the routing layers. However, these are not requirements and, in some embodiments, the separation between the signal vias and the edges of the ground plane may be selected at each layer to provide a desired impedance or to otherwise provide desired electrical properties. In the embodiment of FIG. 10, the antipad 1080 is rectangular in shape.

The via pattern 1000 of layer 712 also includes ground vias 630, 632, 634 and 636 which have the same locations and configurations as the corresponding ground vias in top layer 602. The ground vias typically interconnect the ground planes of all the layers of the backplane 110.

The via pattern 1000 of layer 712 further includes ground shadow vias 640, 642, 644 and 646 which extend vertically through the attachment layers and the routing layers. The diameters of the ground shadow vias in the layer 712 may be smaller than the diameters of the ground shadow vias in the routing layers.

The via pattern 1000 of layer 712 further includes non-plated holes 650, 652, 654 and 656 which have the same locations and configurations as the corresponding non-plated holes in top attachment layer 602. As noted above, the non-plated holes extend to the predetermined depth 742.

Figure 11:
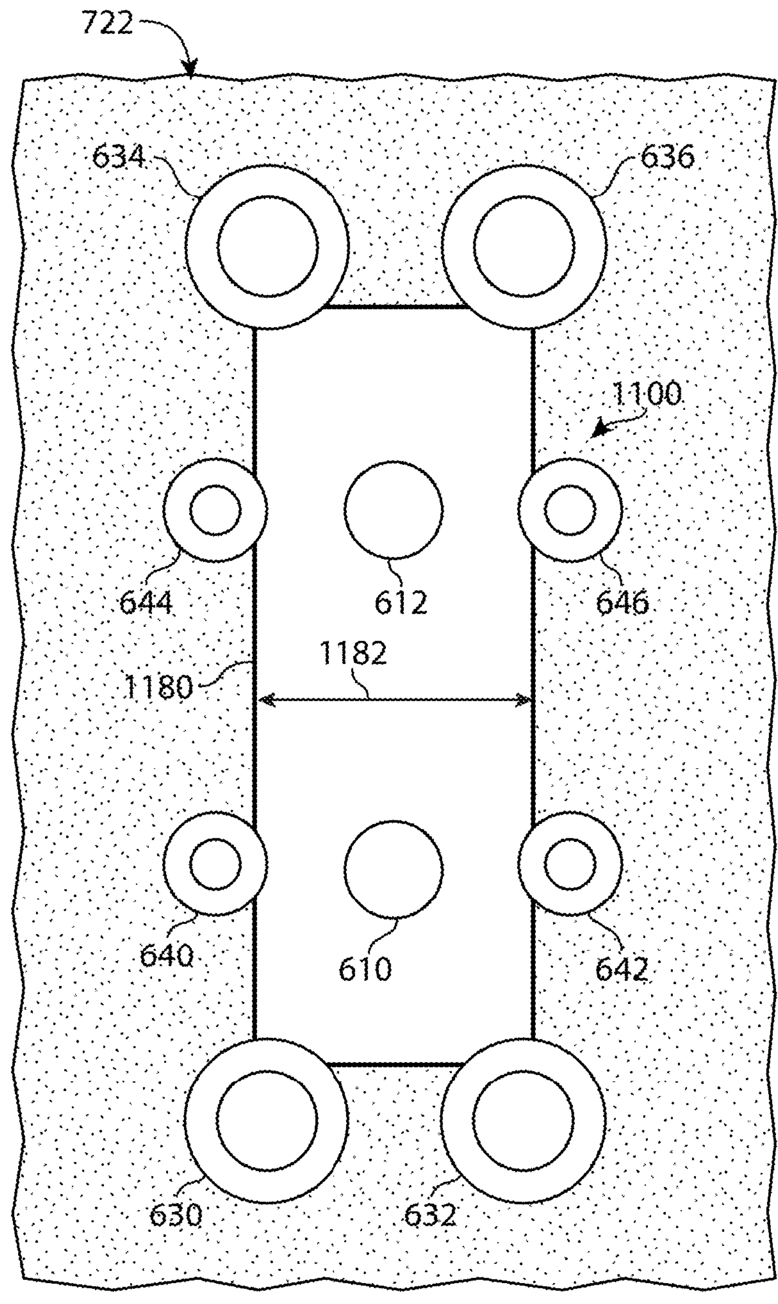
FIG. 11 is a partial top view of a routing layer other than the breakout layer and the routing layers immediately above and immediately below the breakout layer in the printed circuit board of FIGS. 6 and 7.

A partial top view of an embodiment of layer 722 (FIG. 7) is shown in FIG. 11. Layer 722 is a layer below the predetermined depth 742. Layer 722 is representative of the layers between the predetermined depth 742 and the bottom of the backplane 110, with the exception of breakout layer 730 and layers 728 and 732 above and below, respectively, the breakout layer 730. Layer 722 is a routing layer.

A via pattern 1100 is shown in FIG. 11. It will be understood that via pattern 1100 is vertically aligned with via patterns 600 (FIG. 6) and 820 (FIG. 8). It will further be understood that the via pattern 1100 is not visible in the backplane 110 after the layers of the backplane are pressed together.

The via pattern 1100 of layer 722 includes signal vias 610 and 612. The signal vias 610 and 612 may have smaller diameters in the routing layers than in the attachment layers.

In forming the backplane 110, a ground plane 1130 is partially removed to form an eighth antipad 1180 surrounding both signal via 610 and signal via 612. The antipad 1180 may have a width 1182 that is smaller than the width 1082 of antipad 1080 (FIG. 10). The width 1182 of antipad 1180 is selected based on the diameters of signal vias 610 and 612 in layer 722. As such, the width 1182 of the antipad 1180 in the routing layers may be smaller than the width of the antipads in the attachment layers. However, these are not requirements and, in some embodiments, the separation between the signal vias and the edges of the ground plane may be selected at each layer to provide a desired impedance or to otherwise provide desired electrical properties. In the embodiment of FIG. 11, the antipad 1180 is rectangular in shape.

The via pattern 1100 of layer 722 also includes ground vias 630, 632, 634 and 636 which have the same locations and configurations as the corresponding ground vias in top layer 602. The ground vias typically interconnect the ground planes of all the layers of the backplane 110.

The via pattern 1100 of layer 722 further includes ground shadow vias 640, 642, 644 and 646 which extend vertically through the attachment layers and the routing layers. The diameters of the ground shadow vias in the layer 722 may be larger than the diameters of the ground shadow vias in the attachment layers. The non-plated holes 650, 652, 654 and 656 (FIG. 6) do not extend to layer 722 and are not shown in FIG. 11.

In summary, different layers of the backplane 110 may have different antipad configurations to provide a desired performance. Some layers may include a separate antipad surrounding each signal via, with a conductive strip between the antipads. Some layers may include a single antipad that surrounds both of the first and second signal vias. The dimensions of the antipads may be based on the diameters of the signal vias, with larger antipads used with signal vias having larger diameters. The antipads may be configured to enhance signal transmission, for example on the signal breakout layer.

In one non-limiting example corresponding to the via dimensions described above, the width 676 of first and second antipads 670 and 672 is 1.1 mm, the width 836 of third and fourth antipads 830 and 832 is 0.86 mm, the width 936 of fifth and sixth antipads 980 and 982 is 0.86 mm, the width 1082 of seventh antipad 1080 is 1.12 mm, and the width 1182 of eighth antipad 1180 is 0.86 mm. The dividing strips 674, 838 and 938 may have a width of 0.22 mm. It will be understood that these dimensions are not limiting and that other dimensions may be utilized.

A number of features of printed circuit boards are shown and described herein. It will be understood that the features may be utilized separately or in combination in a particular application, without departing from the scope of the present disclosure.

Having thus described at least one illustrative embodiment of the invention, various alterations, modifications and improvements will readily occur to those skilled in the art. For example, layers may be described as upper layers, or "above" or "below" other layers. It should be appreciated these terms are for case of illustration and not a limitation on the orientation of layers. In the embodiment illustrated, "upper" refers to a direction towards a surface of a printed circuit board to which components are attached. In some embodiments, components may be attached to two sides of a printed circuit board, such that upper and lower may depend on which vias are being considered. Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A printed circuit board comprising:

a plurality of layers including attachment layers and routing layers; and via patterns formed in one or more of the plurality of layers, each of the via patterns comprising:

first and second signal vias configured to accept contact tails of signal conductors of a connector;

ground vias configured to accept contact tails of ground conductors of the connector;

ground shadow vias located adjacent to each of the first and second signal vias; and non-plated holes located between each of the ground shadow vias and the signal vias, wherein each of the first and second signal vias is configured with a first section having a first diameter and a second section having a second diameter, less than the first diameter, and wherein the first and second signal vias are plated with a conductive material from a top surface of the printed circuit board at least to a breakout layer of the routing layers.

2. The printed circuit board as defined in claim 1, wherein the non-plated holes extend to a predetermined depth in the plurality of layers.

3. The printed circuit board as defined in claim 2, wherein the predetermined depth is a depth of a boundary between the attachment layers and the routing layers.

4. The printed circuit board as defined in claim 2, wherein the predetermined depth is equal to or greater than a length of the contact tails of the signal conductors of the connector.

5. The printed circuit board as defined in claim 1, wherein the first and second signal vias are not plated with the conductive material below the breakout layer.

6. The printed circuit board as defined in claim 1, wherein each of the ground shadow vias is configured with a third section having a third diameter and a fourth section having a fourth diameter, greater than the third diameter.

7. The printed circuit board as defined in claim 1, wherein each of the ground shadow vias extends through the plurality of layers and is plated with a conductive material through the plurality of layers.

8. The printed circuit board as defined in claim 1, wherein each of the ground vias extends through the plurality of layers and is plated with a conductive material through the plurality of layers.

9. The printed circuit board as defined in claim 1, wherein the attachment layers include a top layer having a first anti pad surrounding the first signal via, a second anti pad surrounding the second signal via and a conductive strip separating the first and second anti pads.

10. The printed circuit board as defined in claim 9, wherein the routing layers include a breakout layer having a third anti pad surrounding the first signal via, a fourth anti pad surrounding the second signal via and a conductive strip separating the third and fourth anti pads.

11. The printed circuit board as defined in claim 10, wherein the routing layers immediately above and immediately below the breakout layer each include a fifth anti pad surrounding the first signal via, a sixth anti pad surrounding the second signal via and a conductive strip separating the fifth and sixth anti pads.

12. The printed circuit board as defined in claim 11, wherein the attachment layers except the top layer each include a seventh anti pad surrounding both the first signal via and the second signal via.

13. The printed circuit board as defined in claim 12, wherein the routing layers except the breakout layer and the routing layers immediately above and immediately below the breakout layer each include an eighth anti pad surrounding both the first signal via and the second signal via.

14. The printed circuit board as defined in claim 1, wherein a center of each of the non-plated holes is equally spaced from respective centers of the of the signal vias and the ground shadow vias.

15. A printed circuit board comprising:

a plurality of layers including attachment layers and routing layers; and via patterns formed in one or more of the plurality of layers, each of the via patterns comprising:

first and second signal vias configured to accept contact tails of signal conductors of a connector, wherein each of the first and second signal vias is configured with a first section having a first diameter in the attachment layers and a second section having a second diameter, less than the first diameter, in the routing layers;

ground vias configured to accept contact tails of ground conductors of the connector;

ground shadow vias located adjacent to each of the first and second signal vias, wherein each of the ground shadow vias is configured with a first section having a third diameter in the attachment layers and a second section having a fourth diameter, greater than the third diameter, in the routing layers; and non-plated holes located between each of the ground shadow vias and the signal vias in the attachment layers.

16. The printed circuit board as defined in claim 15, wherein the first diameter of the first and second signal vias is larger than the third diameter of the ground shadow vias.

17. The printed circuit board as defined in claim 16, wherein the second diameter of the first and second signal vias is larger than the fourth diameter of the ground shadow vias.

18. The printed circuit board as defined in claim 15, wherein the diameter of the non-plated holes is equal to the third diameter of the ground shadow vias.

19. The printed circuit board as defined in claim 15, wherein a center of each of the non-plated holes is equally spaced from respective centers of the signal vias and the ground shadow vias.

20. The printed circuit board as defined in claim 15, wherein the attachment layers include a top layer having a first anti pad surrounding the first signal via, a second anti pad surrounding the second signal via and a conductive strip separating the first and second anti pads.

21. The printed circuit board as defined in claim 20, wherein the routing layers include a breakout layer having a third anti pad surrounding the first signal via, a fourth anti pad surrounding the second signal via and a conductive strip separating the third and fourth anti pads.

22. The printed circuit board as defined in claim 21, wherein the routing layers immediately above and immediately below the breakout layer each include a fifth anti pad surrounding the first signal via, a sixth anti pad surrounding the second signal via and a conductive strip separating the fifth and sixth anti pads.

23. The printed circuit board as defined in claim 22, wherein the attachment layers except the top layer each include a seventh anti pad surrounding both the first signal via and the second signal via.

24. The printed circuit board as defined in claim 23, wherein the routing layers except the breakout layer and the routing layers immediately above and immediately below the breakout layer each include an eighth anti pad surrounding both the first signal via and the second signal via.

25. The printed circuit board as defined in claim 24, wherein the third anti pad, the fourth anti pad, the fifth anti pad and the sixth anti pad have equal widths.

26. The printed circuit board as defined in claim 25, wherein the first and second anti pads have larger widths than the third and fourth anti pads.

27. The printed circuit board as defined in claim 26, wherein the seventh anti pad has a larger width than the eighth anti pad.

* * * * *